(12) United States Patent
Park et al.

(10) Patent No.: US 7,994,582 B2
(45) Date of Patent: Aug. 9, 2011

(54) STACKED LOAD-LESS STATIC RANDOM ACCESS MEMORY DEVICE

(75) Inventors: Han-byung Park, Seongnam-si (KR); Hoon Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 102 days.

(21) Appl. No.: 12/589,101

(22) Filed: Oct. 16, 2009

(65) Prior Publication Data

US 2010/0193871 A1      Aug. 5, 2010

(30) Foreign Application Priority Data

Jan. 30, 2009   (KR) .................. 10-2009-0007387

(51) Int. Cl.
*H01L 27/11* (2006.01)

(52) U.S. Cl. .. 257/368; 257/401; 257/758; 257/E27.098

(58) Field of Classification Search .............. 257/74, 257/368, 401, E27.029, E27.098
See application file for complete search history.

(56) References Cited

U.S. PATENT DOCUMENTS

| | | | | |
|---|---|---|---|---|
| 5,422,296 A | * | 6/1995 | Lage | 438/212 |
| 5,541,431 A | * | 7/1996 | Kawashima | 257/347 |
| 6,723,589 B2 | | 4/2004 | Lee | |
| 7,279,754 B2 | | 10/2007 | Moniwa et al. | |
| 7,479,673 B2 | | 1/2009 | Jang et al. | |
| 7,598,133 B2 | | 10/2009 | Moniwa et al. | |
| 7,838,355 B2 | * | 11/2010 | Anderson et al. | 438/199 |
| 2002/0197794 A1 | | 12/2002 | Lee | |
| 2004/0005755 A1 | | 1/2004 | Moniwa et al. | |
| 2005/0179061 A1 | | 8/2005 | Jang et al. | |
| 2007/0147107 A1 | | 6/2007 | Yang et al. | |
| 2007/0173006 A1 | | 7/2007 | Moniwa et al. | |
| 2008/0023728 A1 | | 1/2008 | Hoon et al. | |
| 2009/0294861 A1 | * | 12/2009 | Thomas et al. | 257/368 |
| 2010/0195375 A1 | * | 8/2010 | Park et al. | 365/156 |

FOREIGN PATENT DOCUMENTS

| | | |
|---|---|---|
| JP | 2004096065 | 3/2004 |
| KR | 1020020096743 A | 12/2002 |
| KR | 1020050073956 A | 7/2005 |
| KR | 100665853 B1 | 1/2007 |

* cited by examiner

*Primary Examiner* — Tuan N. Quach
(74) *Attorney, Agent, or Firm* — Mills & Onello, LLP

(57) ABSTRACT

In a stacked load-less static random access memory (SRAM) device in which a pair of transmission transistors is stacked on a pair of driving transistors, the stacked load-less SRAM device includes first and second transistors arranged in first and second active regions separately on a semiconductor substrate and third and fourth transistors arranged on first and second semiconductor layers over the first and second transistors. A first drain region of the first transistor, a third drain region of the third transistor, and a second gate of the second transistor are electrically connected through a first contact node. A second drain region of the second transistor, a fourth drain region of the fourth transistor, and a first gate of the first transistor are electrically connected through a second contact node.

10 Claims, 14 Drawing Sheets

STACKED LOAD-LESS STATIC RANDOM ACCESS MEMORY DEVICE

CROSS-REFERENCE TO RELATED APPLICATIONS

This application claims the benefit of Korean Patent Application No. 10-2009-0007387, filed on Jan. 30, 2009, in the Korean Intellectual Property Office, the disclosure of which is incorporated herein in its entirety by reference.

BACKGROUND

The inventive concept relates to a semiconductor memory device, and more particularly, to a stacked load-less static random access memory (SRAM) device in which a pair of transmission transistors is stacked on a pair of driving transistors.

Of the different types of memory devices, SRAMs offer relatively low power consumption and relatively rapid response characteristics and are widely used in cache memory devices of computers or mobile electronic products. Unit memory cells of an SRAM can be generally classified as SRAM cells that use a high resistance as a cell load device and complementary metal-oxide semiconductor (CMOS) SRAM cells that use a PMOS transistor. Unit memory cells of SRAM devices can be further classified as thin film transistor SRAM cells that use a thin film transistor as a load device and bulk CMOS SRAM cells that use a bulk transistor as a load device.

A bulk CMOS SRAM cell includes a pair of driving transistors, a pair of load transistors, and a pair of transmission transistors. The pair of driving transistors and the pair of transmission transistors consists of NMOS transistors, and the pair of load transistors consists of PMOS transistors. The bulk CMOS SRAM cell has high cell stability; however, the CMOS SRAM cell also has a low degree of integration and poor latch-up immunity with increased cell size increase since the source and drain regions of the six transistors and channel regions are arranged in a plane on a substrate.

SUMMARY

The inventive concept provides a stacked load-less static random access memory (SRAM) device in which cell size is reduced by stacking a pair of transmission transistors on a pair of driving transistors.

According to an aspect of the inventive concept, there is provided a stacked load-less static random access memory (SRAM) device. The stacked load-less SRAM device may include a semiconductor substrate having first and second active regions which are arranged to be spaced apart from each other. First and second transistors may be arranged on the semiconductor substrate. The first transistor may include a first gate arranged on the first active region and a first source region and a first drain region arranged in the first active region on both sides of the first gate. The second transistor may include a second gate arranged on the second active region of the semiconductor substrate and a second source region and a second drain region arranged in the second active region on both sides of the second gate. The first and second semiconductor layers are arranged on the same layer to respectively overlap the first and second active regions. Third and fourth transistors may be arranged on the first and second semiconductor layers. The third transistor may include a third gate arranged on the first semiconductor layer and a third source region and a third drain region arranged in the first semiconductor layer on both sides of the third gate. The fourth transistor may include a fourth gate arranged on the second semiconductor layer and a fourth source region and a fourth drain region arranged in the second semiconductor layer on both sides of the fourth gate. The first drain region of the first transistor, the third drain region of the third transistor, and the second gate of the second transistor may be electrically connected through a first contact node. The second drain region of the second transistor, the fourth drain region of the fourth transistor, and the first gate of the first transistor may be electrically connected through a second contact node.

The first and second gates may be arranged to respectively cross the first and second active regions, and the third and fourth gates may be arranged to respectively cross the first and second semiconductor layers. The third and fourth gates may be arranged to overlap the first and second gates, and the first and second semiconductor layers may be arranged to respectively overlap portions of the first and second active regions.

A first insulating film may be arranged between the semiconductor substrate on which the first and second transistors are arranged and the first and second semiconductor layers. A second insulating film may be arranged on the first and second semiconductor layers on which the third and fourth transistors are arranged and the first insulating film. First and second contact holes may be formed in the first and second insulating films.

The first contact hole may expose a portion of the first drain region of the first transistor, a portion of the third drain region of the third transistor, and a portion of the second gate of the second transistor. The second contact hole may expose a portion of the second drain region of the second transistor, a portion of the fourth drain region of the fourth transistor, and a portion of the first gate of the first transistor. The first contact node may include a first contact plug arranged in the first contact hole. The second contact node may include a second contact plug arranged in the second contact hole.

The stacked load-less SRAM device may further include a signal line on the second insulating film to cross the first and second semiconductor layers and to overlap the first and second gates. A first portion of the signal line that crosses the first semiconductor layer may function as the third gate of the third transistor, and the a second portion of the signal line that crosses the second semiconductor layer functions as the fourth gate of the fourth transistor.

According to another aspect of the inventive concept, there is provided a stacked load-less SRAM device. The stacked load-less SRAM device may include a semiconductor substrate having first and second active regions defined by a device isolation film. First and second transistors may be arranged on the semiconductor substrate. The first transistor may include a first gate arranged on the first active region of the semiconductor substrate and a first source region and a first drain region, which are arranged in the first active region on both sides of the first gate. The second transistor may include a second gate arranged on the second active region of the semiconductor substrate and a second source region and a second drain region are arranged in the second active region on both sides of the second gate. A first insulating film may be arranged on the semiconductor substrate on which the first and second transistors are arranged. First and second semiconductor layers may be arranged on the first insulating film over the first and second active regions. The third transistor arranged on the first semiconductor layer may include a third gate and a third source region and a third drain region arranged in the first semiconductor layer on both sides of the third gate. The fourth transistor arranged on the second semiconductor layer may include s fourth gate and a fourth source region and a fourth drain region arranged in the second semiconductor layer on both sides of the fourth gate. A second insulating film may be arranged on the first and second semiconductor layers on which the third and fourth transistors are arranged and the first insulating film. The first drain region of the first transistor, the third drain region of the third transistor, and the second gate of the second transistor may be electrically connected. The second drain region of the second transistor, the fourth drain region of the fourth transistor, and the first gate of the first transistor may be electrically connected.

The stacked load-less SRAM device may further include a first contact plug arranged in a first contact hole formed through the first and second insulating films to expose a portion of the first drain region of the first transistor, a portion of the third drain region of the third transistor, and a portion of the second gate of the second transistor, and a second contact plug arranged in a second contact hole formed through the first and second insulating films to expose a portion of the second drain region of the second transistor, a portion of the fourth drain region of the fourth transistor, and a portion of the first gate of the first transistor.

The stacked load-less SRAM device may further include a third insulating film arranged on the first and second semiconductor layers, on which the third and fourth transistors are arranged, and the second insulating film. Third and fourth contact plugs may be buried in third and fourth contact holes that are formed through the first, second and third insulating films to be electrically connected to the first and second source regions of the first and second transistors. A ground power line may be arranged on the third insulating film to be electrically connected to the third and fourth contact plugs.

The stacked load-less SRAM device may further include a fourth insulating film arranged on the third insulating film and the ground power line. Fifth and sixth contact plugs may be buried in fifth and sixth contact holes that are formed through the second through fourth insulating films to be electrically connected to the source regions of the third and fourth transistors. A pair of signal lines may be arranged on the fourth insulating film to be electrically connected to the fifth and sixth contact plugs respectively.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
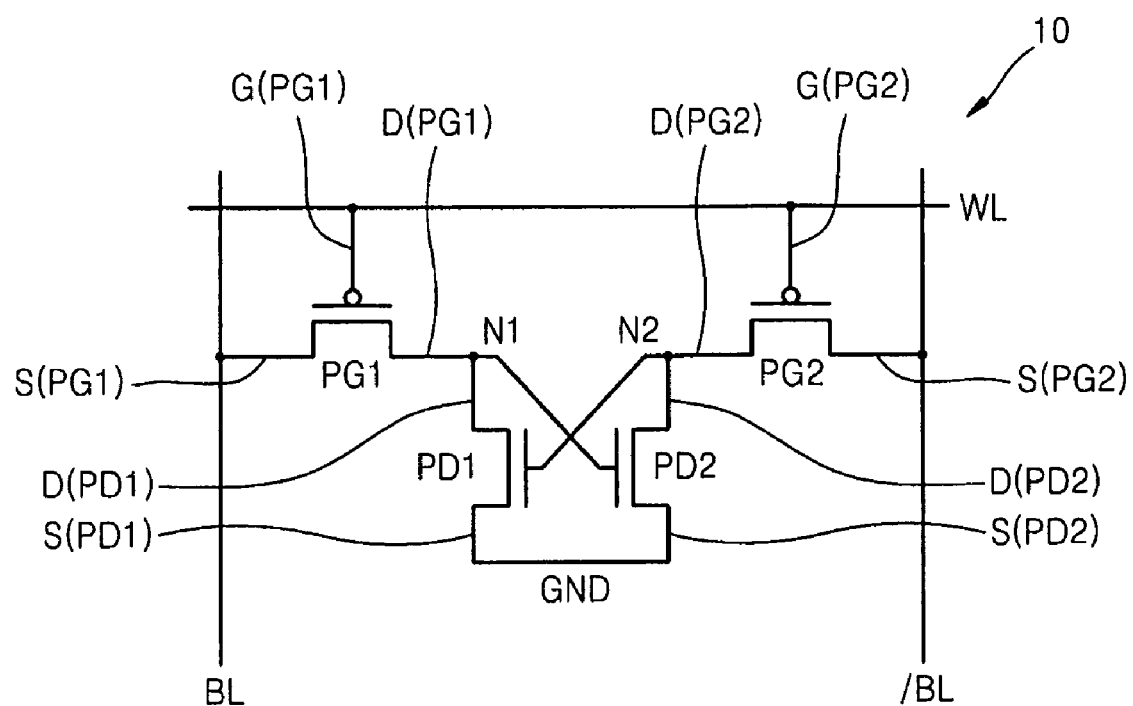
FIG. 1 is an equivalent circuit of a stacked load-less static random access memory (SRAM) according to an embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept to those of ordinary skill in the art. In the drawings, the thicknesses of layers and regions are exaggerated for clarity. Like reference numerals in the drawings denote like elements, and thus their description will be omitted.

FIG. 1 is an equivalent circuit of a stacked load-less static random access memory (SRAM) 10 according to an embodiment of the inventive concept. The stacked load-less SRAM 10 may include unit SRAM cells or a cell array in which a plurality of unit SRAM cells are arranged in an array form.

Referring to FIG. 1, the stacked load-less SRAM 10 includes a pair of bit lines BL and /BL, a word line WL, and four transistors, for example, a pair of transmission transistors PG1 and PG2 and a pair of driving transistors PD1 and PD2. In one embodiment, the first and second transmission transistors PG1 and PG2 may be PMOS transistors, and the first and second driving transistors PD1 and PD2 may be NMOS transistors. In another embodiment, the first and second transmission transistors PG1 and PG2 may be NMOS transistors, and the first and second driving transistors PD1 and PD2 may be PMOS transistors. In other embodiments, the first and second transmission transistors PG1 and PG2 and the first and second driving transistors PD1 and PD2 all may be PMOS transistors or all may be NMOS transistors.

Gates G(PG1) and G(PG2) of the first and second transmission transistors PG1 and PG2 may be connected to the word line WL, and sources S(PG1) and S(PG2) of the first and second transmission transistors PG1 and PG2 may be respectively connected to the first and second bit lines BL and /BL. Sources S(PD1) and S(PD2) of the first and second driving transistors PD1 and PD2 may be connected to a power line GND. In one embodiment, the power line GND may be a ground power line. A drain D(PG1) of the first transmission transistor PG1, a drain D(PD1) of the first driving transistor PD1, and a gate G(PD2) of the second driving transistor PD2 may be connected to a first contact node N1. The drain D(PG2) of the second transmission transistor PG2, a drain D(PD2) of the second driving transistor PD2, and a gate G(PD1) of the first driving transistor PD1 may be connected to a second contact node N2.

The first driving transistor PD1 and the second driving transistor PD2 constitute a latch or a flip-flop. When the first contact node N1 is in a high level, the gate G(PD2) of the second driving transistor PD2 transitions to a high level, and thus, is turned on, and the second contact node N2 is grounded, and thus, transitions to a low level. As the second contact node N2 is in a low level, the gate G(PD1) of the first driving transistor PD1 becomes a low level, and thus, is turned off. Accordingly, the first contact node N1 maintains a high level.

When the second contact node N2 is in a high level, the gate G(PD1) of the first driving transistor PD1 transitions to a high level, and is turned on, and thus, the first contact node N1 is grounded and in a low level. As the first contact node N1 is in a low level, the gate G(PD2) of the second driving transistor PD2 transitions to a low level and is turned off. Thus, the second contact node N2 maintains a high level.

Accordingly, when the first and second transmission transistors PG1 and PG2 are turned on based on a gate driving signal being applied to the word line WL, a data signal applied to the first and second bit lines BL and /BL can be latched to the first and second contact nodes N1 and N2 through the first and second transmission transistors PG1 and PG2.

When the first and second transmission transistors PG1 and PG2 are turned on, the data latched to the first and second contact nodes N1 and N2 is applied to the first and second bit lines BL and /BL through the first and second transmission transistors PG1 and PG2. Accordingly, the data latched to the first and second contact nodes N1 and N2 can be read by sensing the signals applied to the first and second bit lines BL and /BL using a sensing amplifier (not shown).

FIGS. 2A through 2I are plan views for explaining a method of manufacturing the stacked load-less SRAM 10 of FIG. 1, according to an embodiment of the inventive concept. FIGS. 3A through 3I are cross-sectional views taken along section lines IIIA-IIIA through IIII-IIII of FIGS. 2A through 2I for explaining a method of manufacturing the stacked load-less SRAM 10.

Figure 2A:
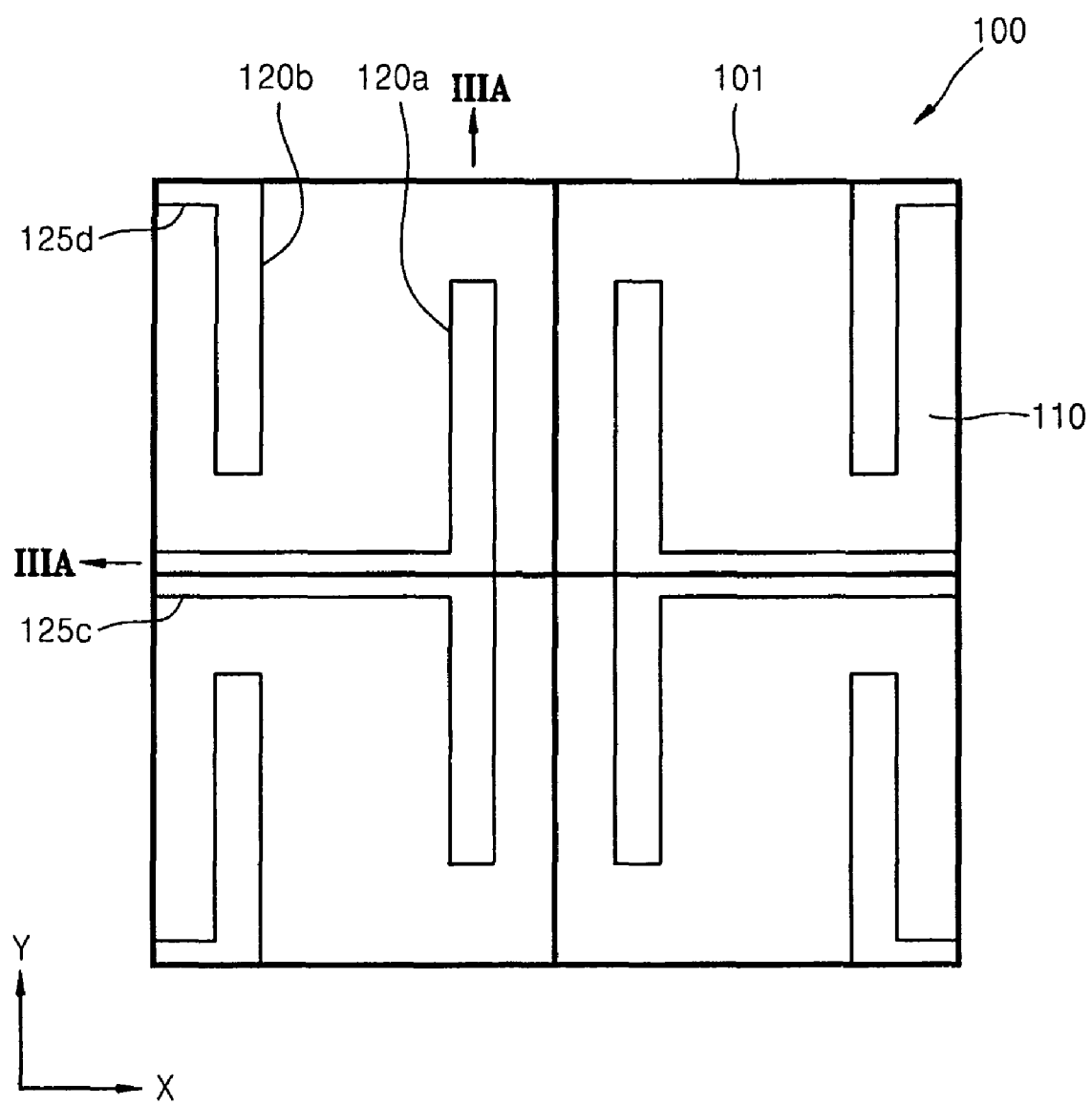
FIGS. 2A through 2I are plan views for explaining a method of manufacturing the stacked load-less SRAM of FIG. 1, according to an embodiment of the inventive concept.
Figure 3A:
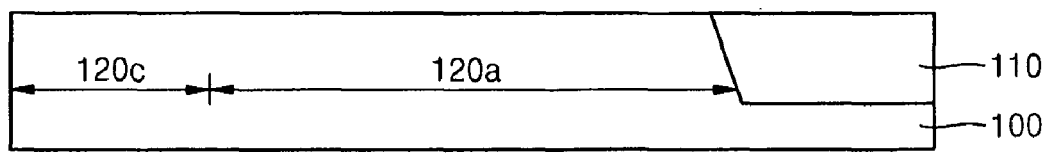
FIGS. 3A through 3I are cross-sectional views taken along section lines IIIA-IIIA through IIII-IIII of FIGS. 2A through 2I for explaining the method of manufacturing a stacked load-less SRAM.

Referring to FIGS. 1, 2A, and 3A, a semiconductor substrate 100 may include a plurality of cell regions 101, where SRAM cells can be respectively arranged, for example, 2×2 cell regions arranged in an array in a first direction (an X direction) and a second direction (a Y direction) crossing the first direction. In each of the cell regions 101 on the semiconductor substrate 100, a first active region 120a and a second active region 120b, which are defined by a device isolation film 110, are separately disposed in the first direction.

The first active region 120a and the second active region 120b may be symmetrically arranged in the cell regions 101 neighboring in the first direction (the X direction) and the second direction (the Y direction) crossing the first direction. The first active region 120a may include an active region of the first driving transistor PD1. The second active region 120b may include an active region of the second driving transistor PD2.

The first active region 120a may include a first protrusion unit 125c that protrudes in the first direction. The first protrusion unit 125c may be arranged over an interface between, or at the border of, two cell regions 101 neighboring in the second direction. The second active region 120b may include a second protrusion unit 125d that protrudes in the first direction. The second protrusion unit 125d may be arranged over an interface between, or at the border of, two cell regions 101 neighboring in the second direction. The first and second protrusion units 125c and 125d may be contact nodes for electrically connecting the ground power line GND to the source regions S(PD1) and S(PD2) of the first and second driving transistors PD1 and PD2 in a subsequent process.

Figure 2B:
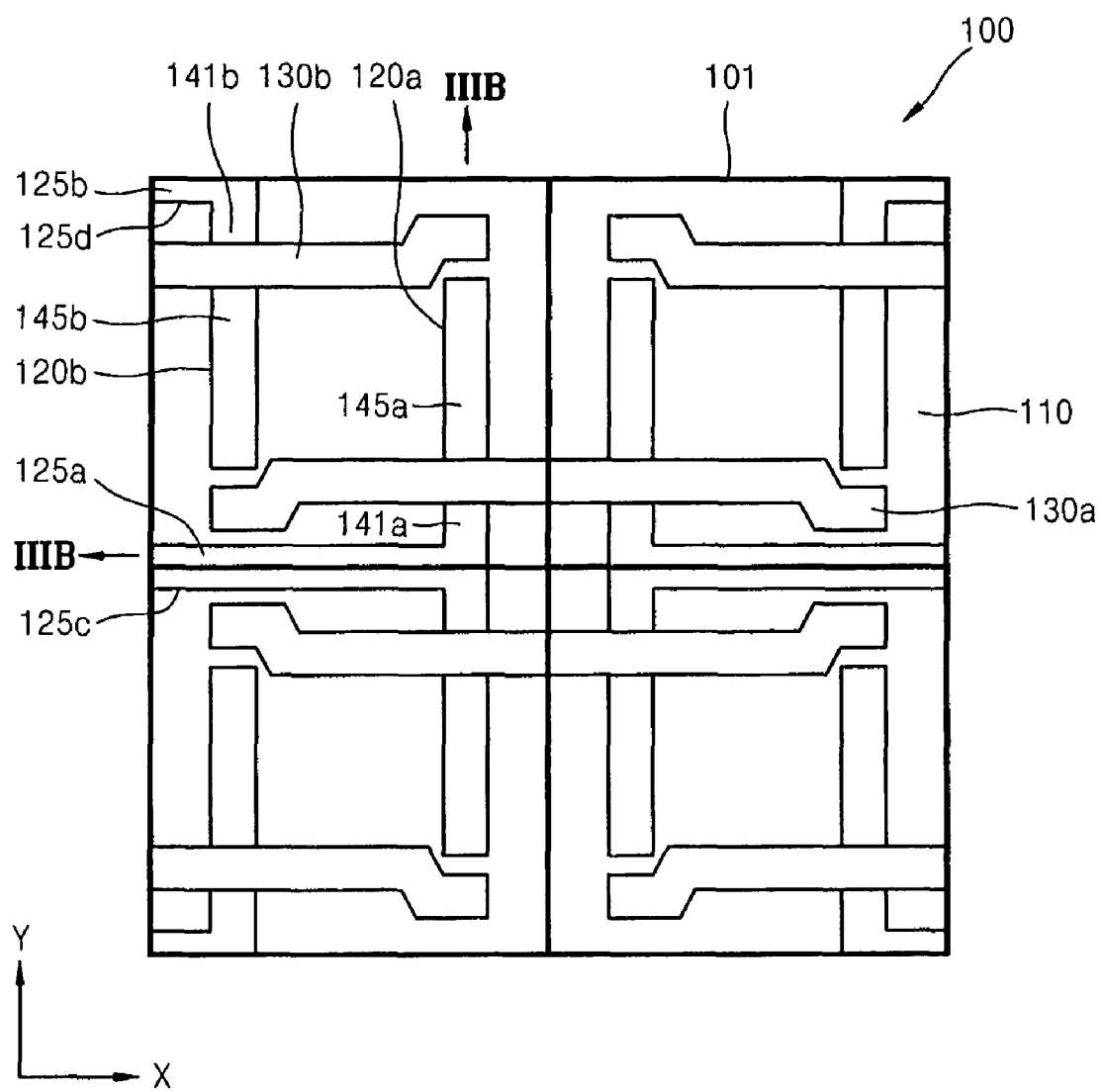
Figure 3B:
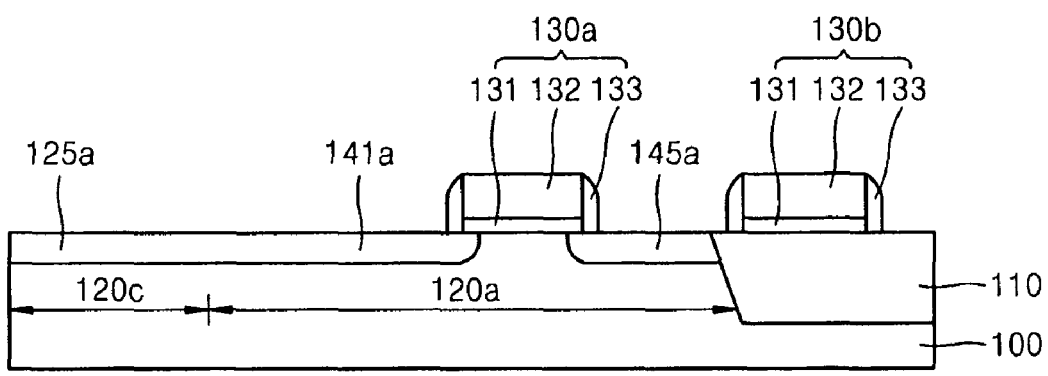

Referring to FIGS. 1, 2B, and 3B, the first and second driving transistors PD1 and PD2 may be formed on the semiconductor substrate 100. A first gate 130a (G(PD1) in FIG. 1) of the first driving transistor PD1 may be arranged on the semiconductor substrate 100 to cross the first active region 120a, and a second gate 130b (G(PD2) in FIG. 1) of the second driving transistor PD2 may be arranged on the semiconductor substrate 100 to cross the second active region 120b.

The first and second gates 130a and 130b may be symmetrically arranged in the cell regions 101 neighboring in the first direction and/or the second direction. Each of the first and second gates 130a and 130b may include a gate insulating film 131 on a portion of the semiconductor substrate 100, a gate electrode material 132 arranged on the gate insulating film 131, and gate spacers 133 arranged on both side walls of the gate electrode material 132 and the gate insulating film 131. The gate electrode material 132 may be a single layer formed of polysilicon or a stacked layer of a polysilicon film and/or a metal silicide layer.

A first source region 141a and a first drain region 145a may be formed in the first active region 120a on both sides of the first gate 130a, and a second source region 141b and a second drain region 145b are formed in the second active region 120b on both sides of the second gate 130b. The first and second source regions 141a and 141b and the first and second drain regions 145a and 145b may have a lightly-doped drain (LDD) structure with the same dopant type, for example, an N+ type dopant.

When the first and second source regions 141a and 141b and the first and second drain regions 145a and 145b are formed, a first connection region 125a that extends from the first source region 141a is formed in the first protrusion unit 125c, and a second connection region 125b that extends from the second source region 141b is formed in the second protrusion unit 125d. The first and second connection regions 125a and 125b, the first and second source regions 141a and 141b, and the first and second drain regions 145a and 145b may be formed using a blanket ion injection process.

Figure 2C:
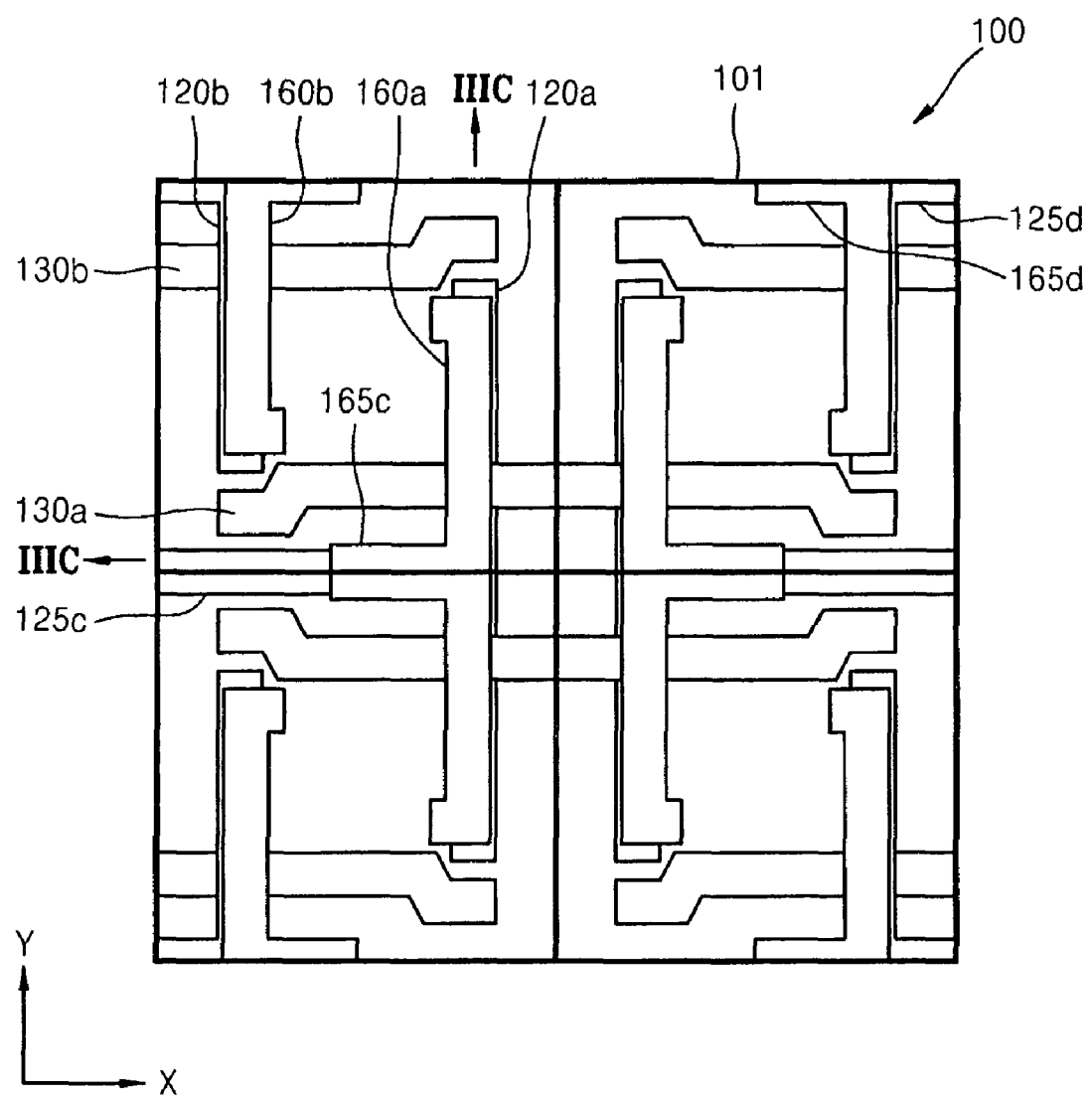
Figure 3C:
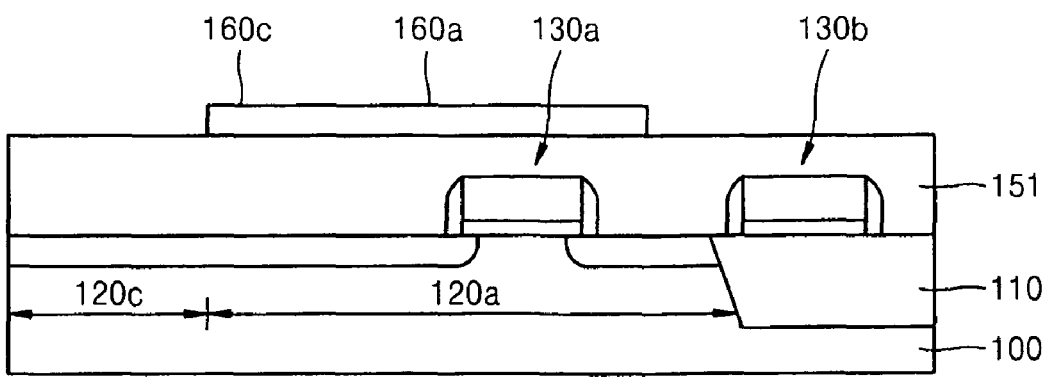

Referring to FIGS. 1, 2C, and 3C, a first insulating film 151 may be formed on the semiconductor substrate 100 on which the first and second driving transistors PD1 and PD2 are arranged. The first insulating film 151 may comprise an interlayer insulating layer. A first active pattern 160a and a second active pattern 160b are formed on the first insulating film 151. The first active pattern 160a may function as a semiconductor layer of the first transmission transistor PG1. The second active pattern 160b may function as a semiconductor layer of the second transmission transistor PG2. The first and second active patterns 160a and 160b may be patterns formed of a material comprising silicon.

The first active pattern 160a may overlap the first active region 120a and may be arranged to cross the first gate 130a. The first active pattern 160a may include a third protrusion unit 165c that protrudes in the first direction. The third protrusion unit 165c may be arranged over an interface of two cell regions 101 neighboring in the second direction, and may overlap the first protrusion unit 125c.

The second active pattern 160b may overlap the second active region 120b and may be arranged to cross the second gate 130b. The second active pattern 160b may include a fourth protrusion unit 165d that protrudes in the first direction. The fourth protrusion unit 165d may be arranged over an interface between, or at the border of, two cell regions 101 neighboring in the second direction, and may protrude in the first direction in a direction opposite to the second protrusion unit 125d.

The first and second active patterns 160a and 160b may be symmetrically arranged in the cell regions 101 neighboring in the first direction and/or the second direction. Contact nodes may be arranged on the third and fourth protrusion units 165c and 165d in a subsequent process to electrically connect the source regions S(PG1) and S(PG2) of the first and second transmission transistors PG1 and PG2 to the first and second bit lines BL and /BL respectively.

Figure 2D:
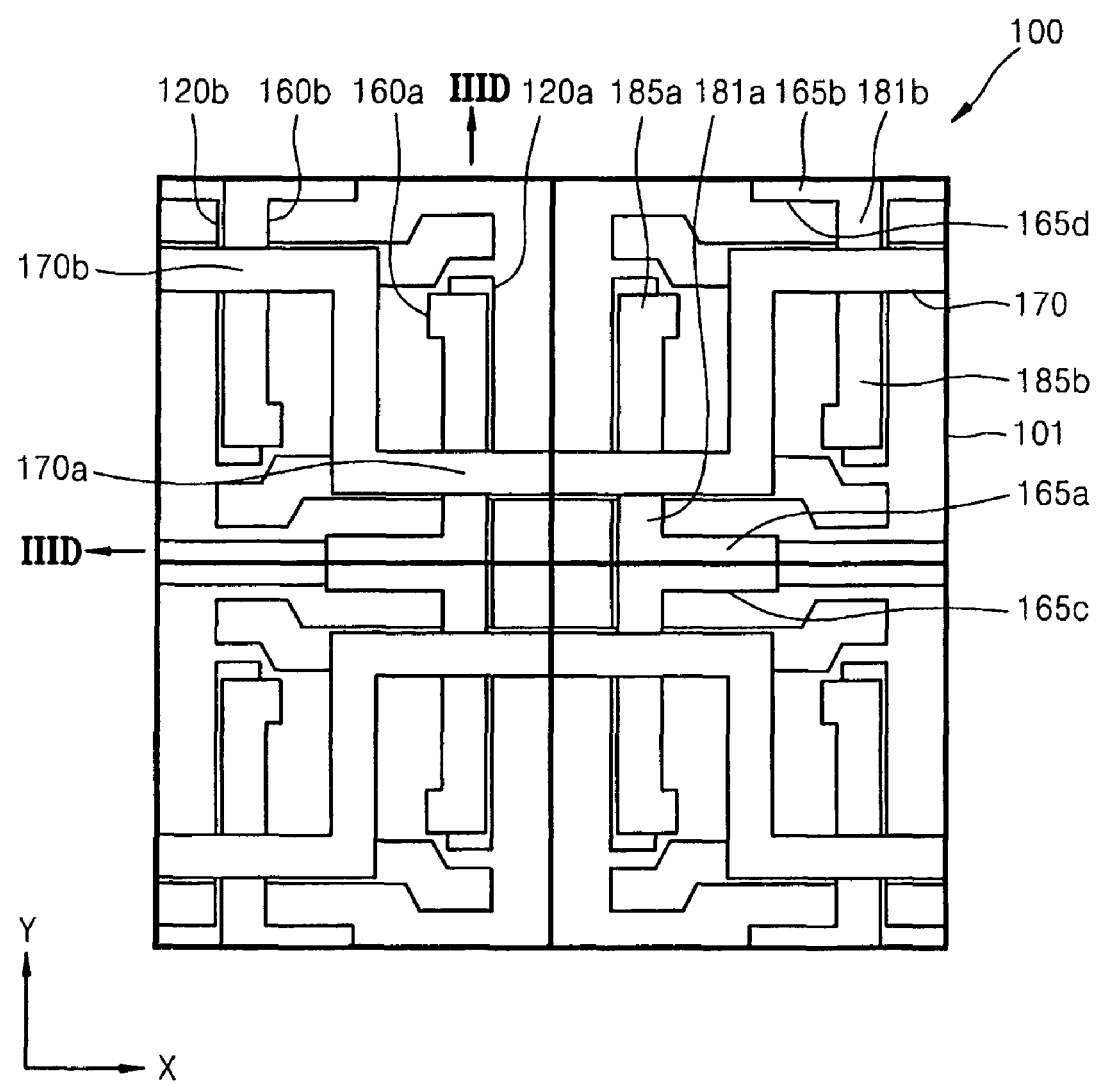
Figure 3D:
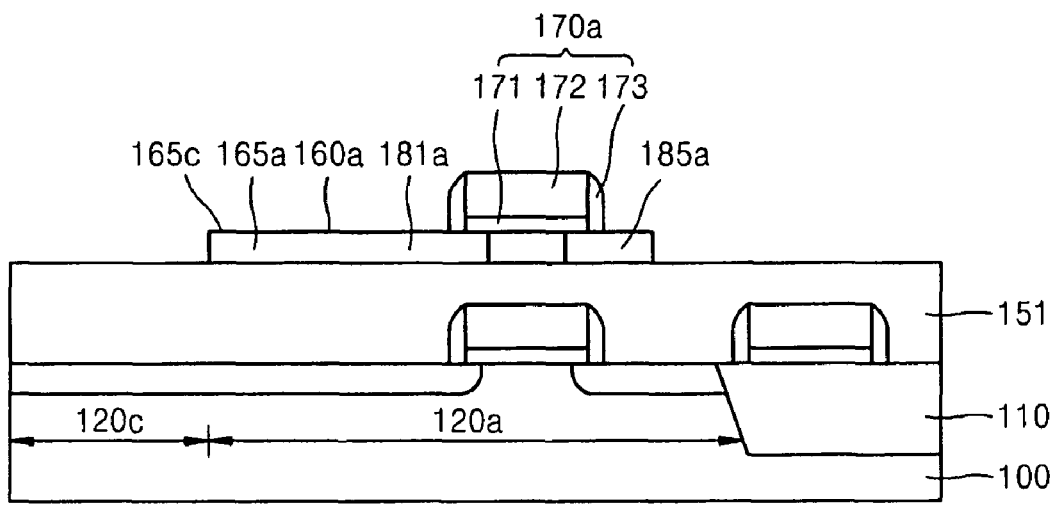

Referring to FIGS. 1, 2D, and 3D, the first transmission transistor PG1 may be formed on the first active pattern 160a, and the second transmission transistor PG2 is formed on the second active pattern 160b. A word line 170 may be arranged on the first insulating film 151 to cross the first active pattern 160a and the second active pattern 160b in the first direction. The word line 170 may be arranged in a zig-zagged or meandering shape to overlap portions of the first gate 130a of the first driving transistor PD1 and the second gate 130b of the second driving transistor PD2.

A first portion 170a of the word line 170, that overlaps the first active pattern 160a, functions as the first gate G(PG1) of the first transmission transistor PG1, and a second portion 170b of the word line 170, that overlaps the second active pattern 160b, functions as the second gate G(PG2) of the first transmission transistor PG2. The word line 170 may be symmetrically arranged in the cell regions 101 neighboring in the first direction and/or the second direction.

The word line 170 may each include a gate insulating film 171 formed on a portion of the first active pattern 160a and the second active pattern 160b respectively, a gate electrode material 172 formed on the gate insulating film 171, and gate spacers 173 arranged on both side walls of the gate electrode material 172 and the gate insulating film 171. The gate electrode material 172 may be a single layer formed of polysilicon or a stacked layer of a polysilicon film and a metal layer and/or a metal silicide layer.

A third source region 181a and a third drain region 185a of the first transmission transistor PG1 are arranged in the first active pattern 160a on both sides of the third gate 170a. A fourth source region 181b and a fourth drain region 185b of the second transmission transistor PG2 are arranged in the second active pattern 160b on both sides of the fourth gate 170b. A portion of the first active pattern 160a between the third source region 181a and the third drain region 185a may function as a channel region of the first transmission transistor PG1. A portion of the second active pattern 160b between the fourth source region 181b and a fourth drain region 185b may function as a channel region of the second transmission transistor PG2.

When the third and fourth source regions 181a and 181b and the third and fourth drain regions 181b and 185b are formed, a third connection region 165a that extends from the third source region 181a may be formed in the third protrusion unit 165c, and a fourth connection region 165b that extends from the fourth source region 181b may be formed in the fourth protrusion unit 165d. The third and fourth connection regions 165a and 165b, the third and fourth source regions 181a and 181b, and the third and fourth drain regions 185a and 185b may be formed of the same conductivity type material, for example, a P+ type dopant using a blanket ion injection process.

Figure 2E:
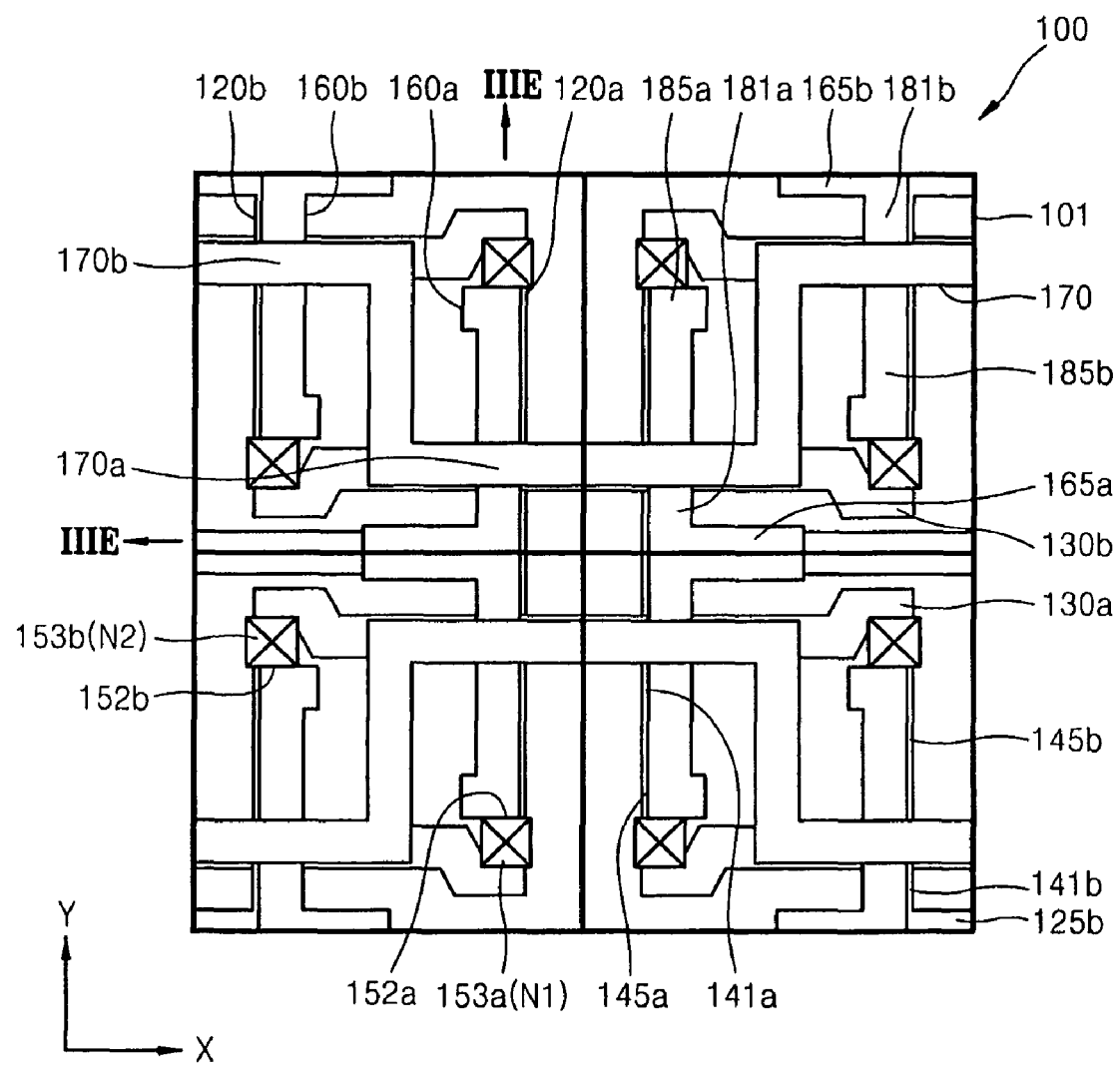
Figure 3E:
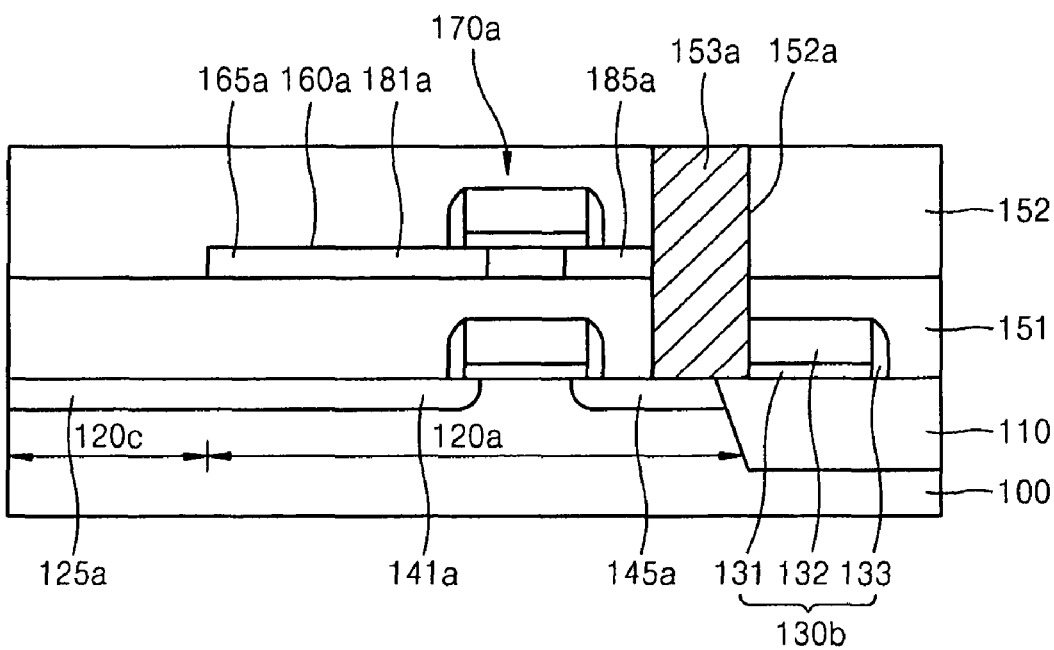

Referring to FIGS. 1, 2E, and 3E, a second insulating film 152 is formed on the first active pattern 160a on which the first transmission transistor PG1 is formed, the second active pattern 160b on which the second transmission transistor PG2 is formed, and the first insulating film 151. The second insulating film 152 may include an interlayer insulating layer. First and second contact holes 152a and 152b are formed in the first and second insulating films 151 and 152 respectively by etching the first and second insulating films 151 and 152 using a photoresist film (not shown) as a mask. Then, the photoresist film may be removed. During the etching process, portions of the gate spacers 133 of the first and second gates 130a and 130b of the first and second driving transistors PD1 and PD2 that face the gate spacers 133 of the second and first gates 130b and 130a of the second and first driving transistors PD2 and PD1 may be respectively removed.

The first contact hole 152a may be formed to expose at least a portion of the first drain region 145a of the first driving transistor PD1, a portion of the third drain region 185a of the first transmission transistor PG1, and a portion of the gate electrode material 132 of the second gate 130b of the second driving transistor PD2. The second contact hole 152b may be formed to expose at least a portion of the second drain region 145b of the second driving transistor PD2, a portion of the fourth drain region 185b of the second transmission transistor PG2, and a portion of the gate electrode material 132 of the first gate 130a of the first driving transistor PD1.

A conductive film, for example, a metal film, is formed on the second insulating film 152 to bury the first and second contact holes 152a and 152b. The metal film may be a tungsten film. A first contact plug 153a is formed in the first contact hole 152a and a second contact plug 153b is formed in the second contact hole 152b by etching the metal film using a chemical mechanical polishing (CMP) process or an etch-back process.

The first contact plug 153a may function as the first contact node N1 that electrically connects the first drain region 145a of the first driving transistor PD1, the third drain region 185a of the first transmission transistor PG1, and the gate electrode material 132 of the second gate 130b of the second driving transistor PD2. The second contact plug 153b may function as the second contact node N2 that electrically connects the second drain region 145b of the second driving transistor PD2, the fourth drain region 185b of the second transmission transistor PG, and the gate electrode material 132 of the first gate 130a of the first driving transistor PD1.

Figure 2F:
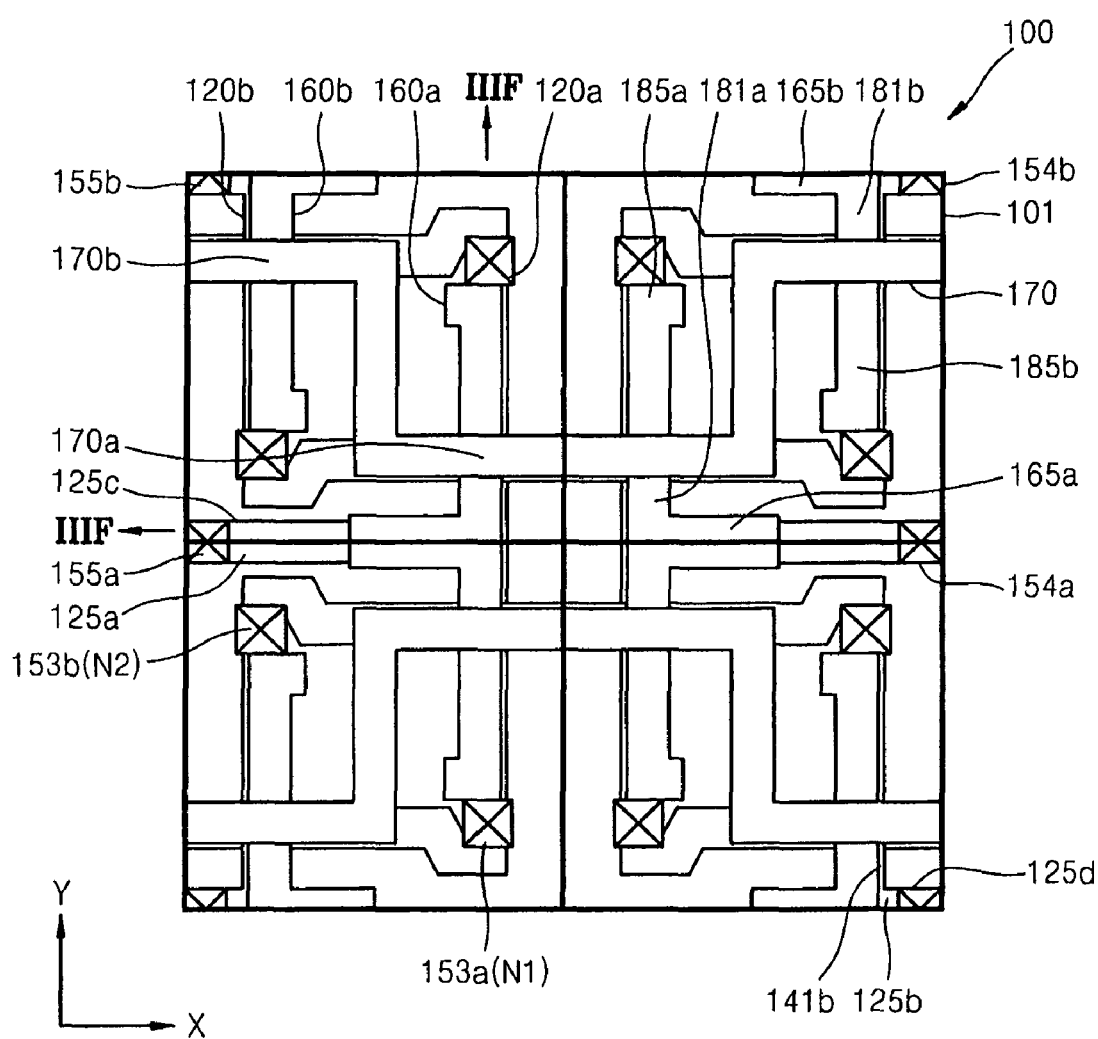
Figure 3F:
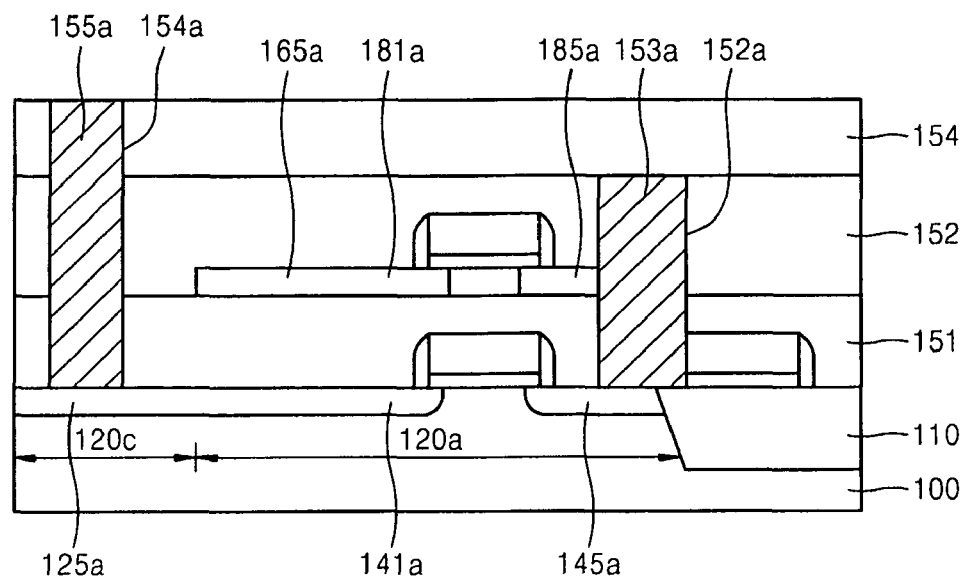

Referring to FIGS. 1, 2F, and 3F, a third insulating film 154 may be formed on the second insulating film 152. Third and fourth contact holes 154a and 154b may be formed in the first through third insulating films 151, 152, and 154 by etching the first through third insulating films 151, 152, and 154 using a photoresist film (not shown) as a mask. Then, the photoresist film may be removed. The third contact hole 154a may expose a portion of the first connection region 125a, and the fourth contact hole 154b may expose a portion of the second connection region 125b.

Next, a conductive film, for example, a metal film, may be formed on the third insulating film 154 to bury the third and fourth contact holes 154a and 154b. The conductive film may be a tungsten film. Third and fourth contact plugs 155a and 155b that are to be connected to a ground power line 190, to be explained below in connection with FIGS. 2G and 3G, are reactively formed in the third and fourth contact holes 154a and 154b by etching the conductive film using a CMP process or an etch-back process.

Figure 2G:
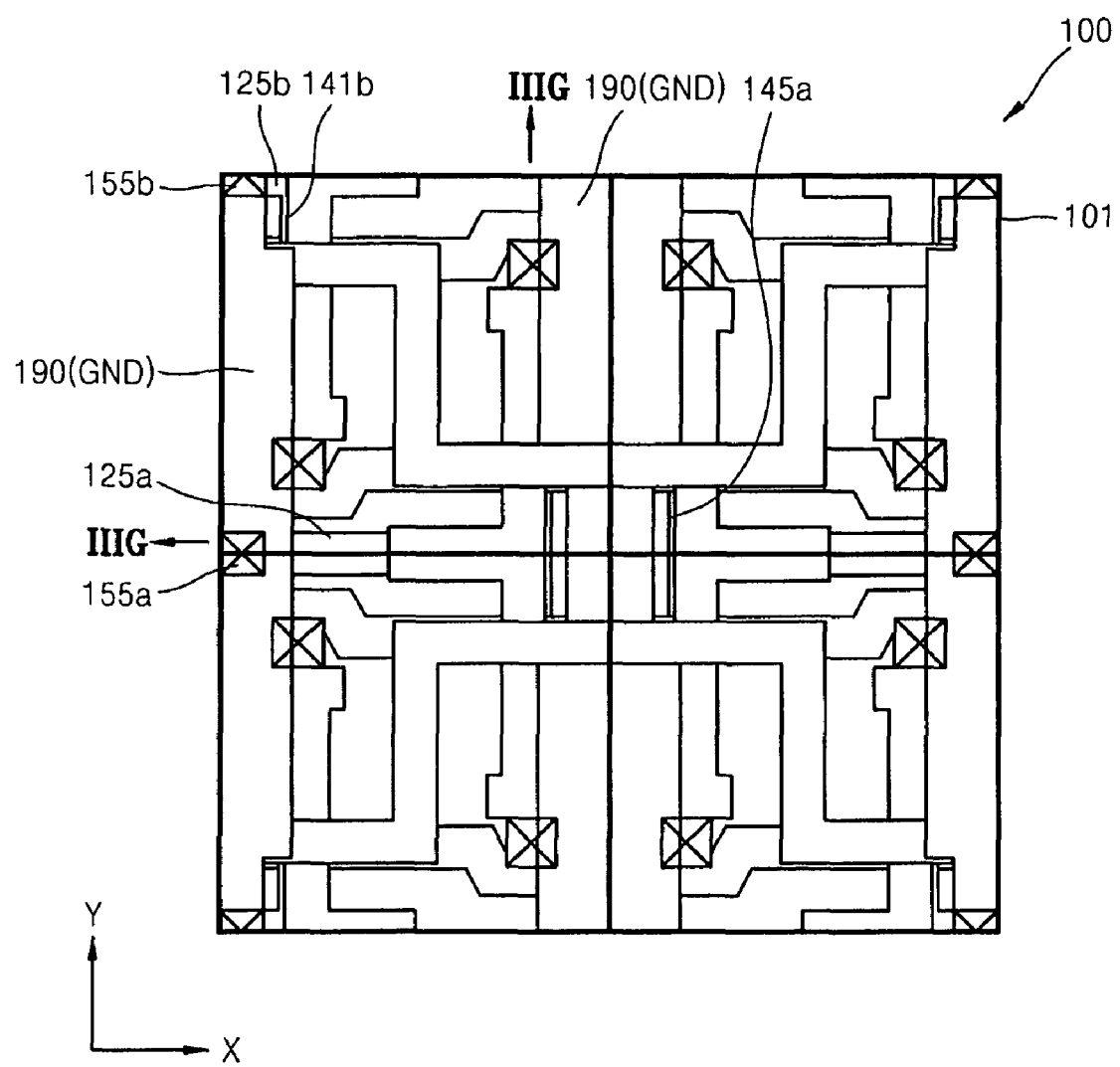
Figure 3G:
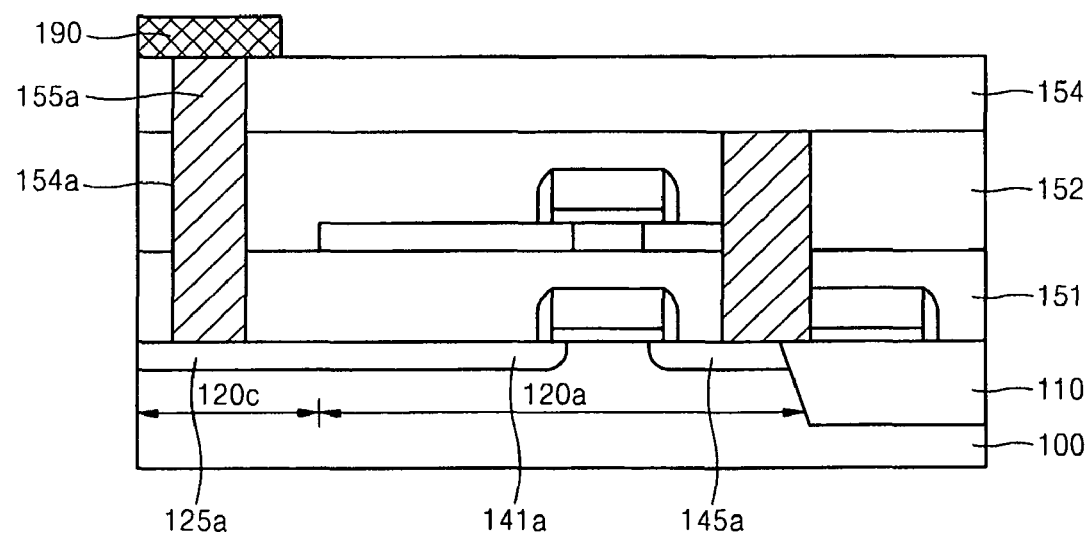

Referring to FIGS. 1, 2G, and 3G, the ground power line 190 which is a conductive film formed of a metal may be formed on the third insulating film 154 to contact the third and fourth contact plugs 155a and 155b. The ground power line 190 and the third and fourth contact holes 154a and 154b may be symmetrically arranged in the cell regions 101 neighboring in the first direction and/or the second direction. The first source region 141a of the first driving transistor PD1 may be electrically connected to the ground power line 190 through the third contact plug 155a, and the second source region 141b of the second driving transistor PD2 may be electrically connected to the ground power line 190 through the fourth contact plug 155b.

Figure 2H:
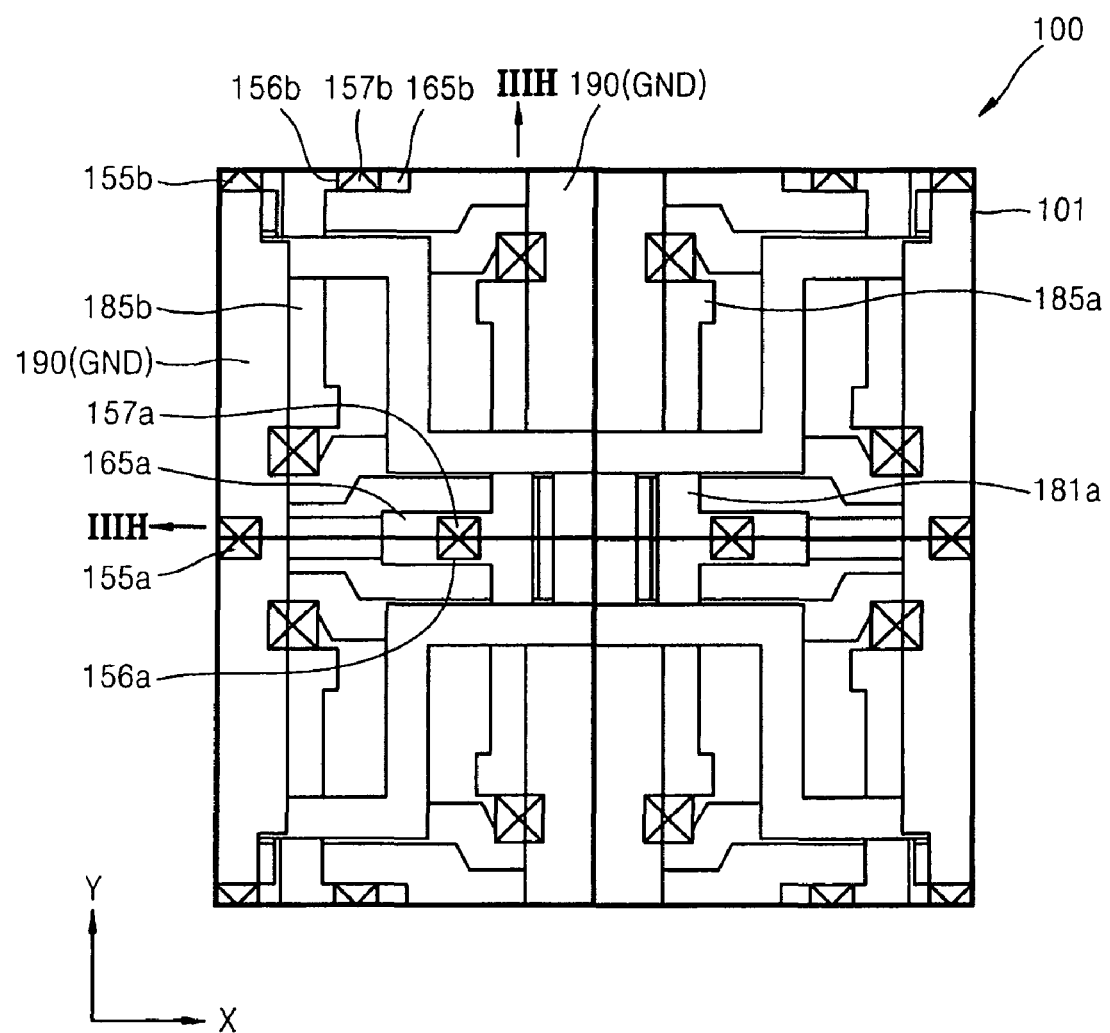
Figure 3H:
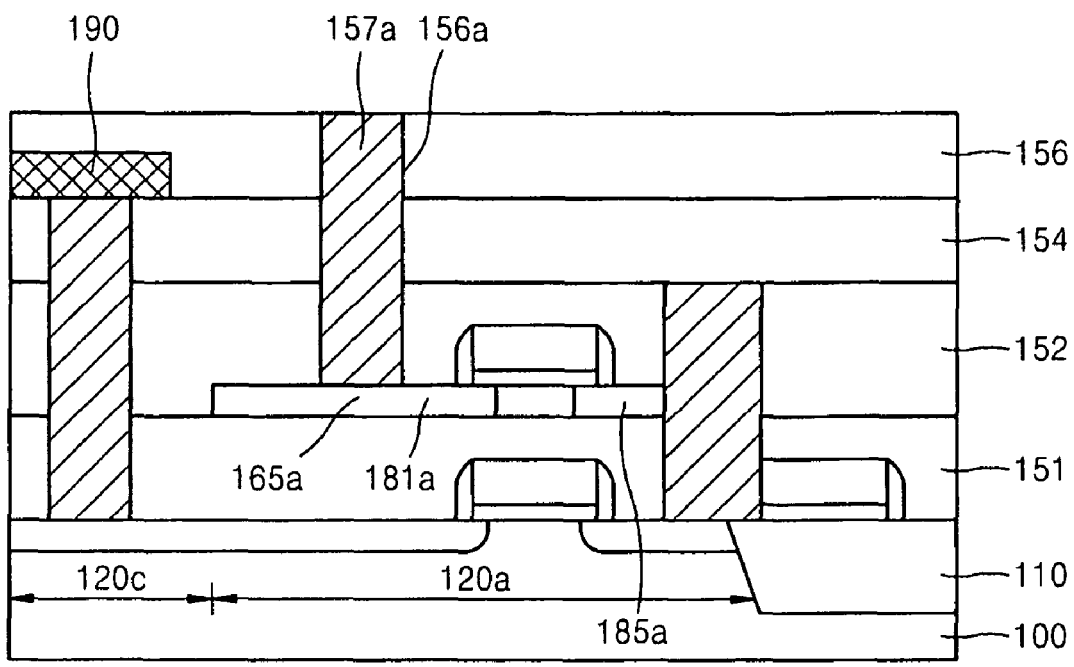

Referring to FIGS. 1, 2H, and 3H, a fourth insulating film 156 may be formed on the ground power line 190 and the third insulating film 154. The fourth insulating film 156 may comprise an interlayer insulating layer. Fifth and sixth contact holes 156a and 156b may be formed in the second through fourth insulating films 152, 154, and 156 by etching the second through fourth insulating films 152, 154, and 156 using a photoresist film (not shown) as an etch mask. The fifth contact hole 156a may expose a portion of the third connection region 165a, and the sixth contact hole 156b may expose a portion of the fourth connection region 165b.

A conductive film such as a metal film may be formed on the fourth insulating film 156 to bury the fifth and sixth contact holes 156a and 156b. The conductive film may be a tungsten film. A fifth contact plug 157a is formed in the fifth contact hole 156a and a sixth contact plug 157b may be formed in the sixth contact hole 156b by etching the conductive film using a CMP process or an etch-back process.

Figure 2I:
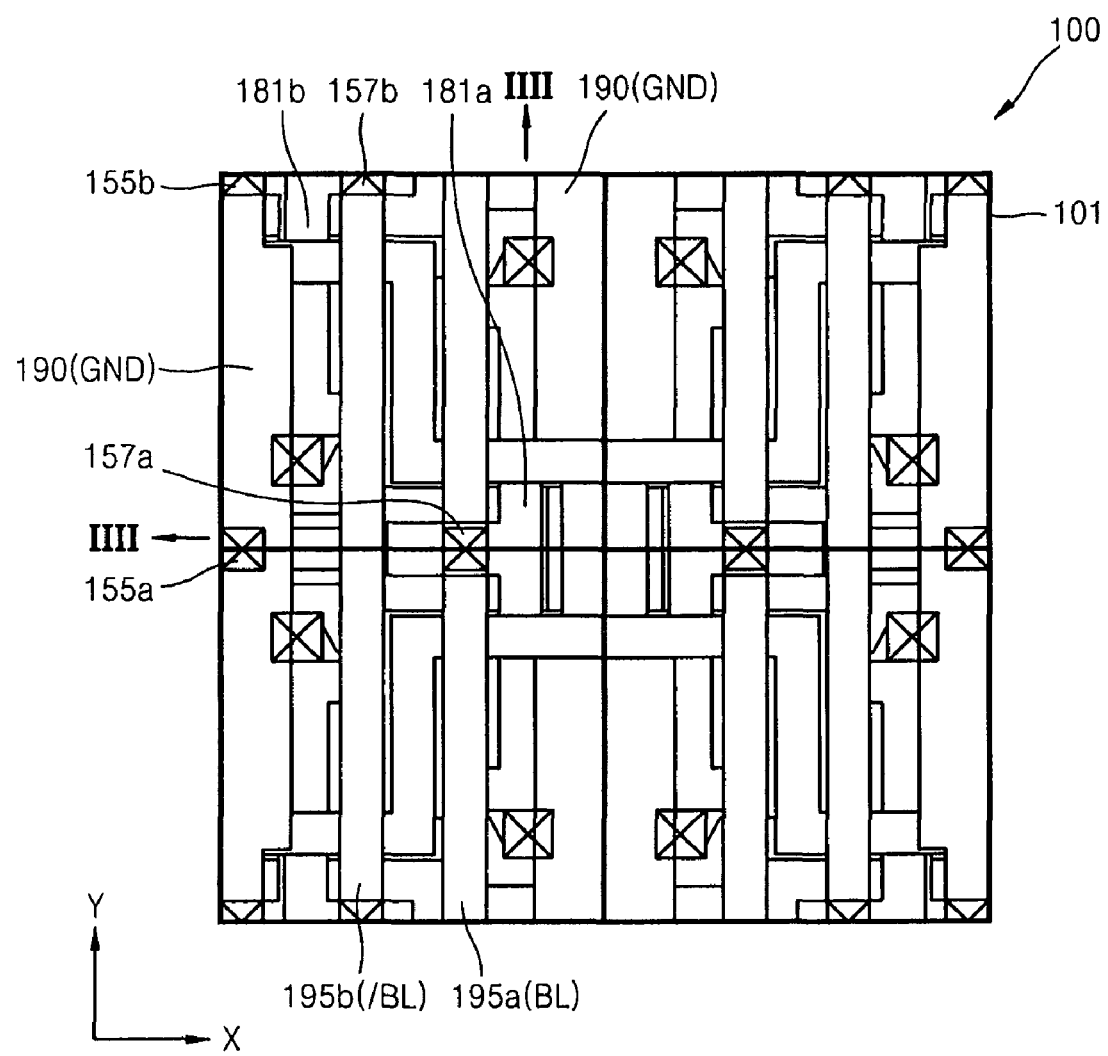
Figure 3I:
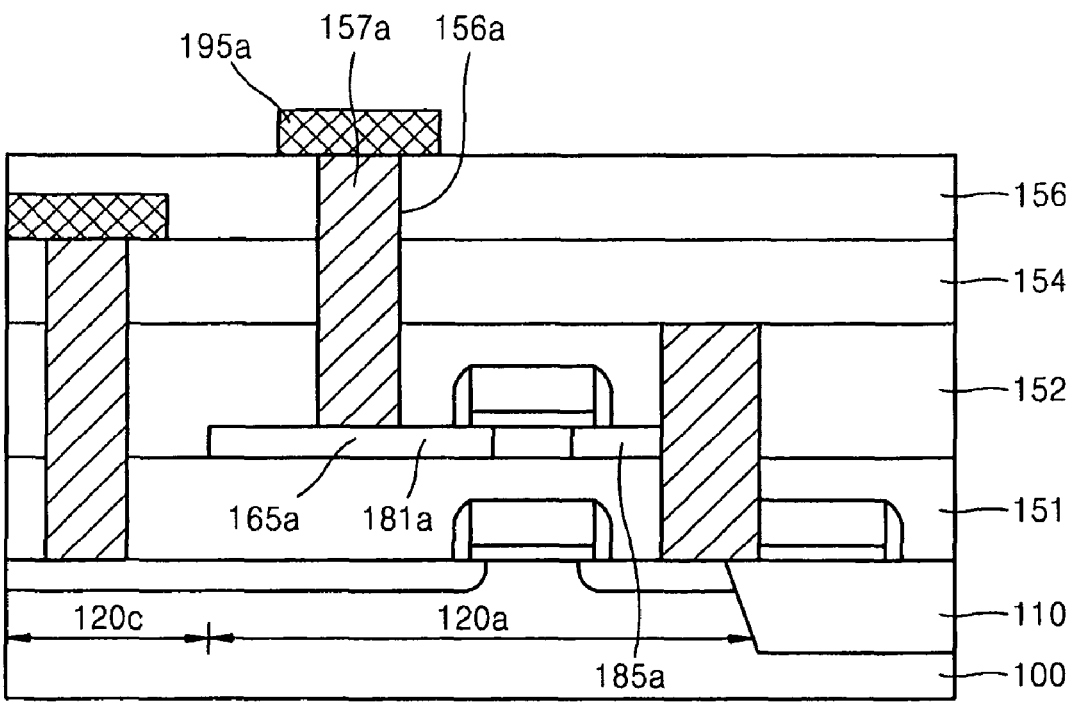

Referring to FIGS. 1, 2I, and 3I, first and second bit lines 195a and 195b that respectively contact the fifth and sixth contact plugs 157a and 157b may be formed on the fourth insulating film 156. The first and second bit lines 195a and 195b may be arranged parallel to the ground power line 190 in the first direction. The first and second bit lines 195a and 195b may be symmetrically arranged in the cell regions 101 neighboring in the first direction and/or the second direction. The first bit line 195a is electrically connected to the third source region 181a through the fifth contact plug 157a, and the second bit line 195b is electrically connected to the fourth source region 181b through the sixth contact plug 157b.

In the stacked load-less SRAM 10 according to the present embodiment of the inventive concept, SRAM cells arranged respectively in the cell regions 101 may be symmetrically arranged in the first direction and/or the second direction.

While the inventive concept has been particularly shown and described with reference to exemplary embodiments thereof, it will be understood that various changes in form and details may be made therein without departing from the spirit and scope of the following claims.

What is claimed is:

1. A stacked load-less static random access memory (SRAM) device comprising:
   a semiconductor substrate having first and second active regions which are spaced apart from each other;
   a first transistor having a first gate arranged on the first active region of the semiconductor substrate, and a first source region and a first drain region arranged in the first active region on both sides of the first gate;
   a second transistor having a second gate arranged on the second active region of the semiconductor substrate, and a second source region and a second drain region arranged in the second active region on both sides of the second gate;
   a first semiconductor layer arranged to overlap the first active region;
   a third transistor having a third gate arranged on the first semiconductor layer and a third source region and a third drain region arranged in the first semiconductor layer on both sides of the third gate;
   a second semiconductor layer arranged on the same layer as the first semiconductor layer to overlap the second active region; and
   a fourth transistor having a fourth gate arranged on the second semiconductor layer and a fourth source region and a fourth drain region arranged in the second semiconductor layer on both sides of the fourth gate,
   wherein the first drain region of the first transistor, the third drain region of the third transistor, and the second gate of the second transistor are electrically connected through a first contact node, and
   wherein the second drain region of the second transistor, the fourth drain region of the fourth transistor, and the first gate of the first transistor are electrically connected through a second contact node.

2. The stacked load-less SRAM device of claim 1, wherein:
   the first and second gates are arranged to respectively cross the first and second active regions, and the third and fourth gates are arranged respectively to cross the first and second semiconductor layers, and
   the third and fourth gates are arranged to overlap the first and gates, and the first and second semiconductor layers are arranged to respectively overlap portions of the first and second active regions.

3. The stacked load-less SRAM device of claim 1, further comprising:
   a first insulating film arranged between the semiconductor substrate, on which the first and second transistors are arranged, and the first and second semiconductor layers; and
   a second insulating film arranged on the first and second semiconductor layers, on which the third and fourth transistors are arranged, and the first insulating film, first and second contact holes being formed in the first and second insulating films,
   wherein the first contact hole exposes a portion of the first drain region of the first transistor, a portion of the third drain region of the third transistor, and a portion of the second gate of the second transistor, and
   wherein the second contact hole exposes a portion of the second drain region of the second transistor, a portion of the fourth drain region of the fourth transistor, and a portion of the first gate of the first transistor.

4. The stacked load-less SRAM device of claim 3, wherein the first contact node comprises a first contact plug arranged in the first contact hole, and
   the second contact node comprises a second contact plug arranged in the second contact hole.

5. The stacked load-less SRAM device of claim 3, further comprising a signal line on the second insulating film crossing the first and second semiconductor layers and overlapping the first and second gates, wherein
   a first portion of the signal line that crosses the first semiconductor layer functions as the third gate of the third transistor, and the a second portion of the signal line that crosses the second semiconductor layer functions as the fourth gate of the fourth transistor.

6. A stacked load-less SRAM device comprising:
   a semiconductor substrate having first and second active regions which are defined by a device isolation film;
   a first transistor having a first gate arranged on the first active region of the semiconductor substrate and a first source region and a first drain region arranged in the first active region on both sides of the first gate;
   a second transistor having a second gate arranged on the second active region of the semiconductor substrate and a second source region and a second drain region arranged in the second active region on both sides of the second gate;
   a first insulating film arranged on the semiconductor substrate on which the first and second transistors are arranged;
   a first semiconductor layer arranged on the first insulating film over the first active region;
   a second semiconductor layer arranged on the first insulating film over the second active region;
   a third transistor having a third gate arranged on the first semiconductor layer and a third source region and a third drain region arranged in the first semiconductor layer on both sides of the third gate;
   a fourth transistor having a fourth gate arranged on the second semiconductor layer and a fourth source region and a fourth drain region arranged in the second semiconductor layer on both sides of the fourth gate; and
   a second insulating film arranged on the first and second semiconductor layers, on which the third and fourth transistors are arranged, and the first insulating film,
   wherein the first drain region of the first transistor, the third drain region of the third transistor, and the second gate of the second transistor are electrically connected, and
   wherein the second drain region of the second transistor, the fourth drain region of the fourth transistor, and the first gate of the first transistor are electrically connected.

7. The stacked load-less SRAM device of claim 6, further comprising:
- a first contact plug arranged in a first contact hole formed through the first and second insulating films to expose a portion of the first drain region of the first transistor, a portion of the third drain region of the third transistor, and a portion of the second gate of the second transistor; and
- a second contact plug arranged in a second contact hole formed through the first and second insulating films to expose a portion of the second drain region of the second transistor, a portion of the fourth drain region of the fourth transistor, and a portion of the first gate of the first transistor.

8. The stacked load-less SRAM device of claim 6, wherein the first and second semiconductor layers respectively comprise silicon patterns.

9. The stacked load-less SRAM device of claim 6, further comprising:
- a third insulating film arranged on the first and second semiconductor layers, on which third and fourth transistors are arranged, and the second insulating film;
- third and fourth contact plugs that are buried in third and fourth contact holes that are formed through the first, second and third insulating films to be electrically connected to the first and second source regions of the first and second transistors; and
- a ground power line that is arranged on the third insulating film to be electrically connected to the third and fourth contact plugs.

10. The stacked load-less SRAM device of claim 9, further comprising:
- a fourth insulating film arranged on the third insulating film and the ground power line;
- fifth and sixth contact plugs that are buried in fifth and sixth contact holes formed through the second, third and fourth insulating films to be electrically connected to the third and fourth source regions of the third and fourth transistors; and
- a pair of signal lines arranged on the fourth insulating film to be electrically connected to the fifth and sixth contact plugs respectively.

* * * * *